(12) United States Patent
Chao

(10) Patent No.: US 8,653,883 B2
(45) Date of Patent: Feb. 18, 2014

(54) VOLTAGE DOUBLER AND OSCILLATING CONTROL SIGNAL GENERATOR THEREOF

(75) Inventor: Kuang-Wei Chao, Taoyuan County (TW)

(73) Assignee: Nanya Technology Corporation, Taoyuan (TW)

( * ) Notice: Subject to any disclaimer, the term of this patent is extended or adjusted under 35 U.S.C. 154(b) by 0 days.

(21) Appl. No.: 13/472,364

(22) Filed: May 15, 2012

(65) Prior Publication Data

US 2013/0307612 A1     Nov. 21, 2013

(51) Int. Cl.
*G05F 1/10* (2006.01)

(52) U.S. Cl.
USPC .................................................. 327/536

(58) Field of Classification Search
USPC .................................................. 327/536
See application file for complete search history.

(56) References Cited

U.S. PATENT DOCUMENTS

| | | | | |
|---|---|---|---|---|
| 5,982,222 A | * | 11/1999 | Kyung | 327/536 |
| 6,373,326 B1 | * | 4/2002 | Tomari | 327/536 |
| 6,492,862 B2 | * | 12/2002 | Nakahara | 327/536 |
| 6,667,662 B2 | * | 12/2003 | Saito | 331/1 A |
| 7,429,883 B2 | * | 9/2008 | Do | 327/264 |
| 7,583,133 B2 | * | 9/2009 | Ivanov et al. | 327/536 |
| 7,605,639 B2 | * | 10/2009 | Gou | 327/536 |
| 7,898,317 B2 | * | 3/2011 | Choi | 327/535 |
| 8,283,971 B2 | * | 10/2012 | Shin | 327/536 |
| 8,421,523 B2 | * | 4/2013 | Kwon | 327/536 |
| 2008/0157856 A1 | * | 7/2008 | Lee | 327/536 |
| 2012/0140578 A1 | * | 6/2012 | Goto et al. | 365/189.07 |
| 2012/0153986 A1 | * | 6/2012 | Kim | 326/16 |

* cited by examiner

*Primary Examiner* — Thomas J Hiltunen

(57) ABSTRACT

A voltage doubler and an oscillating control signal generator controlling a charge pump (powered by a first voltage to provide a second voltage) of the voltage doubler are disclosed. The oscillating control signal generator includes a first input terminal receiving a fundamental oscillation signal, a second input terminal receiving a comparison result showing whether the second voltage is greater than a target value, a third input terminal operative to obtain an electric current consumption status at an output terminal of the charge pump, and an output terminal outputting an oscillating control signal for the control of the charge pump. Further, the oscillating control signal generator includes a logic circuit. The logic circuit generates the oscillating control signal by selectively blocking status changes of the fundamental oscillation signal according to the comparison result and the electric current consumption status.

16 Claims, 10 Drawing Sheets

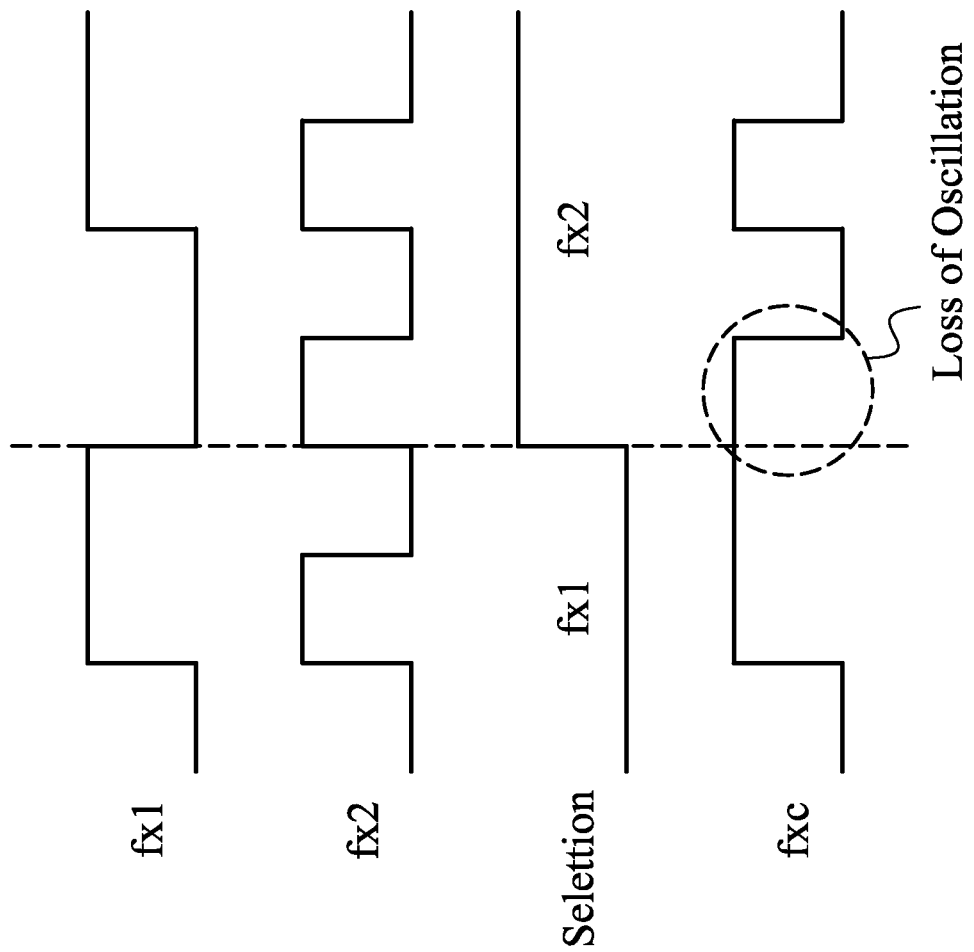

VOLTAGE DOUBLER AND OSCILLATING CONTROL SIGNAL GENERATOR THEREOF

BACKGROUND OF THE INVENTION

1. Field of the Invention

The present invention relates to voltage doublers, and in particular relates to oscillating control signal generators thereof.

2. Description of the Related Art

A voltage doubler is commonly used to generate a voltage at a level higher than the supply voltage (not limited to twice of the supply voltage). In this manner, the generated voltage can be used in powering a device which has to be operated by a voltage higher than the supply voltage. For example, an LED driver, an LCD driver, a memory (e.g. DRAM, SRAM) and so on may require a voltage doubler.

In conventional techniques, a charge pump may be used to implement the voltage doubler. A charge pump may use a capacitor as a power storage element. According to an oscillating control signal, the charge pump charges the capacitor to provide a voltage at a level higher than the supply voltage. The charging of the capacitor depends on the frequency of the oscillation control signal. Generally, multiple oscillation signals, of different oscillation frequencies, are provided as candidates for the oscillating control signal. By a multiplexing design, the appropriate one of the oscillation signals is selected to input the charge pump to properly control the charging of the capacitor.

However, by the multiplexing design, it is difficult to timely switch the frequency of the oscillating control signal without affecting the efficiency of the voltage doubler. FIG. 1 shows a multiplexing design, which outputs an oscillating control signal fxc selected from the oscillation signals fx1 and fx2. The selection signal of the multiplexer Mux is named stb. In FIG. 2A, the frequency of the oscillating control signal fxc is switched from the frequency of fx1 to that of fx2 and, when the frequency switching occurs, the oscillation signal fx2 is low. As shown, the oscillating control signal fsc has an asymmetric duty cycle, which affects the efficiency of the voltage doubler. In FIG. 2B, the frequency of the oscillating control signal fxc is switched from the frequency of fx1 to that of fx2 and, when the frequency switching occurs, the oscillation signal fx2 rises to a high level. Accordingly, as shown, the oscillating control signal fsc cannot be timely transformed to the high oscillation frequency and loss of oscillation occurs. In FIG. 2C, the frequency of the oscillating control signal fxc is switched from the frequency of fx2 to that of fx1, and the switching of the selection signal stb is synchronized with the falling edge of the oscillating signal fx2. However, a glitch occurs due to PVT variations, which affects the efficiency of the voltage doubler.

Thus, an oscillating control signal generator generating an oscillating control signal working in a symmetric duty cycle and reacting timely and without glitches is called for.

BRIEF SUMMARY OF THE INVENTION

A voltage doubler and an oscillating control signal generator thereof are disclosed.

A voltage doubler in accordance with an exemplary embodiment of the invention comprises a charge pump, a comparator, a fundamental oscillation signal generator and an oscillating control signal generator.

The charge pump is powered by a first voltage and has a capacitor as an energy storage element. The charge pump is controlled in accordance with an oscillating control signal. According to the oscillating control signal, the charge pump charges the capacitor and thereby controls a second voltage provided by the capacitor. The second voltage is coupled to the comparator for obtaining a comparison result presenting whether the second voltage is greater than a target value. According to the comparison result, the fundamental oscillation signal generator generates a fundamental oscillation signal. By selectively blocking status changes of the fundamental oscillation signal according to the comparison result and an electric current consumption status at an output terminal of the charge pump, the oscillating control signal generator generates the oscillating control signal which controls the charge pump.

In another exemplary embodiment, an oscillating control signal generator, for a charge pump powered by a first voltage to provide a second voltage, is disclosed. The disclosed oscillating control signal generator comprises a first input terminal receiving a fundamental oscillation signal, a second input terminal receiving a comparison result showing whether the second voltage is greater than a target value, a third input terminal operative to obtain an electric current consumption status at an output terminal of the charge pump, and an output terminal outputting an oscillating control signal for the control of the charge pump. Further, the oscillating control signal generator comprises a logic circuit. The logic circuit generates the oscillating control signal by selectively blocking status changes of the fundamental oscillation signal according to the comparison result and the electric current consumption status.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein:

FIGS. 2A, 2B and 2C are waveforms showing an asymmetric duty cycle problem, an oscillation loss problem and a glitch problem caused by the multiplexing design of FIG. 1;

DETAILED DESCRIPTION OF THE INVENTION

The following description shows several exemplary embodiments carrying out the invention. This description is made for the purpose of illustrating the general principles of the invention and should not be taken in a limiting sense. The scope of the invention is best determined by reference to the appended claims.

Figure 1:
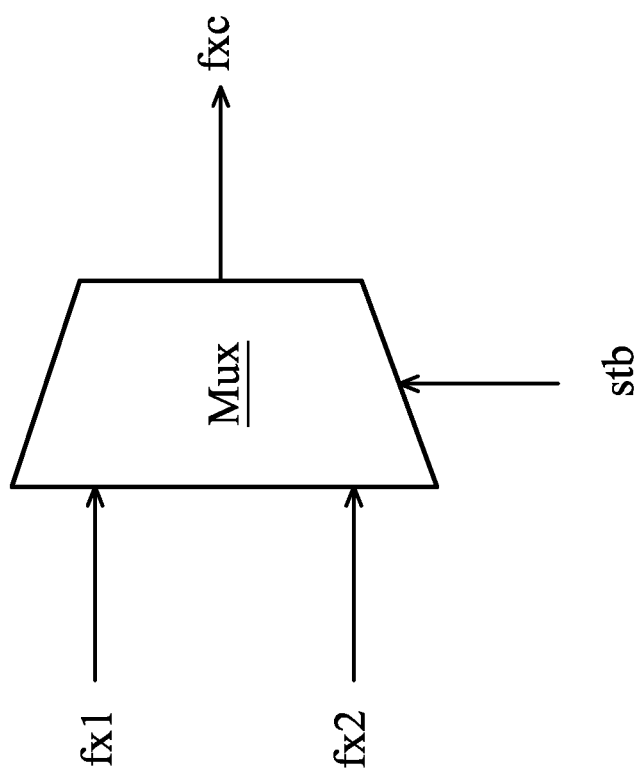
FIG. 1 shows a multiplexing design, which outputs an oscillating control signal fxc selected from the oscillation signals fx1 and fx2, wherein the selection signal of the multiplexer Mux is named stb.
Figure 2A:
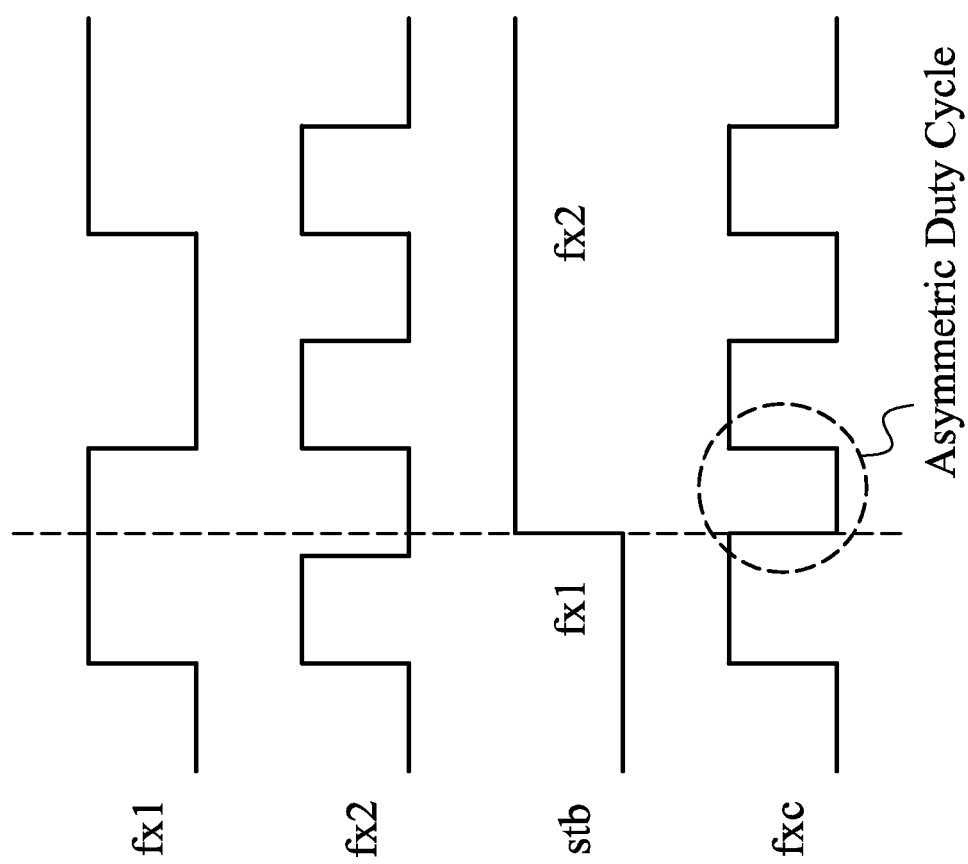
Figure 2C:
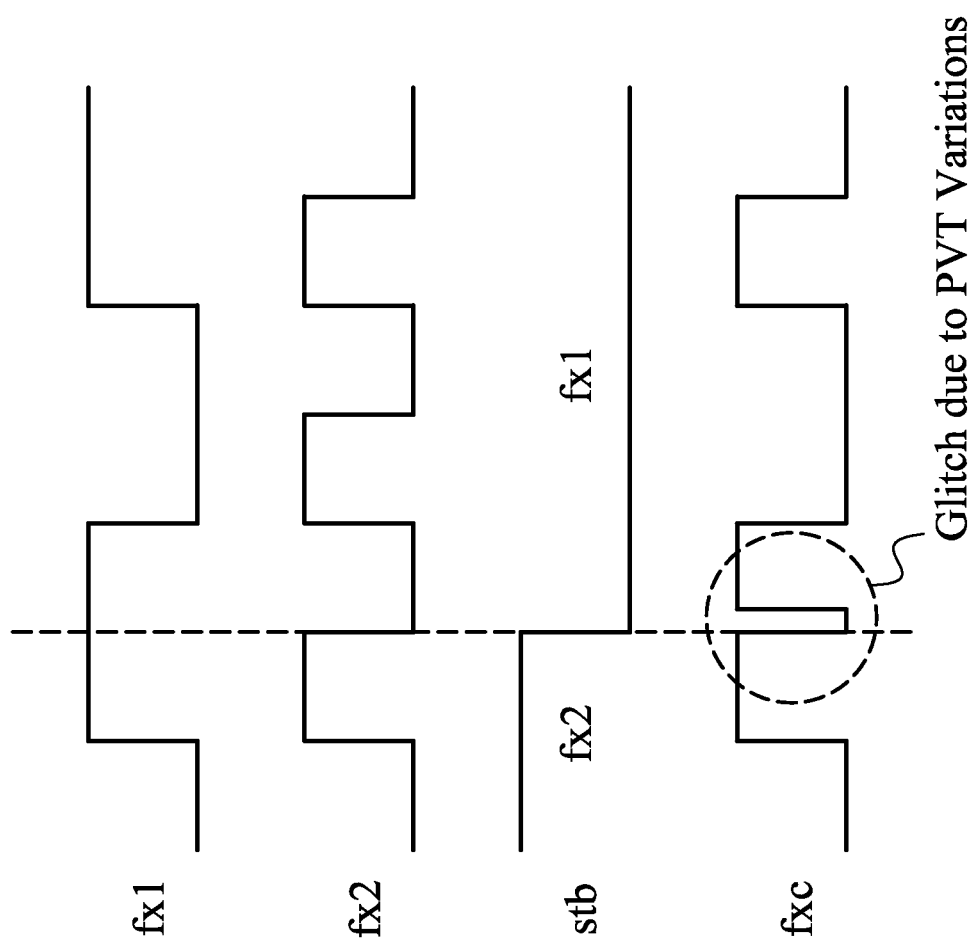
Figure 3:
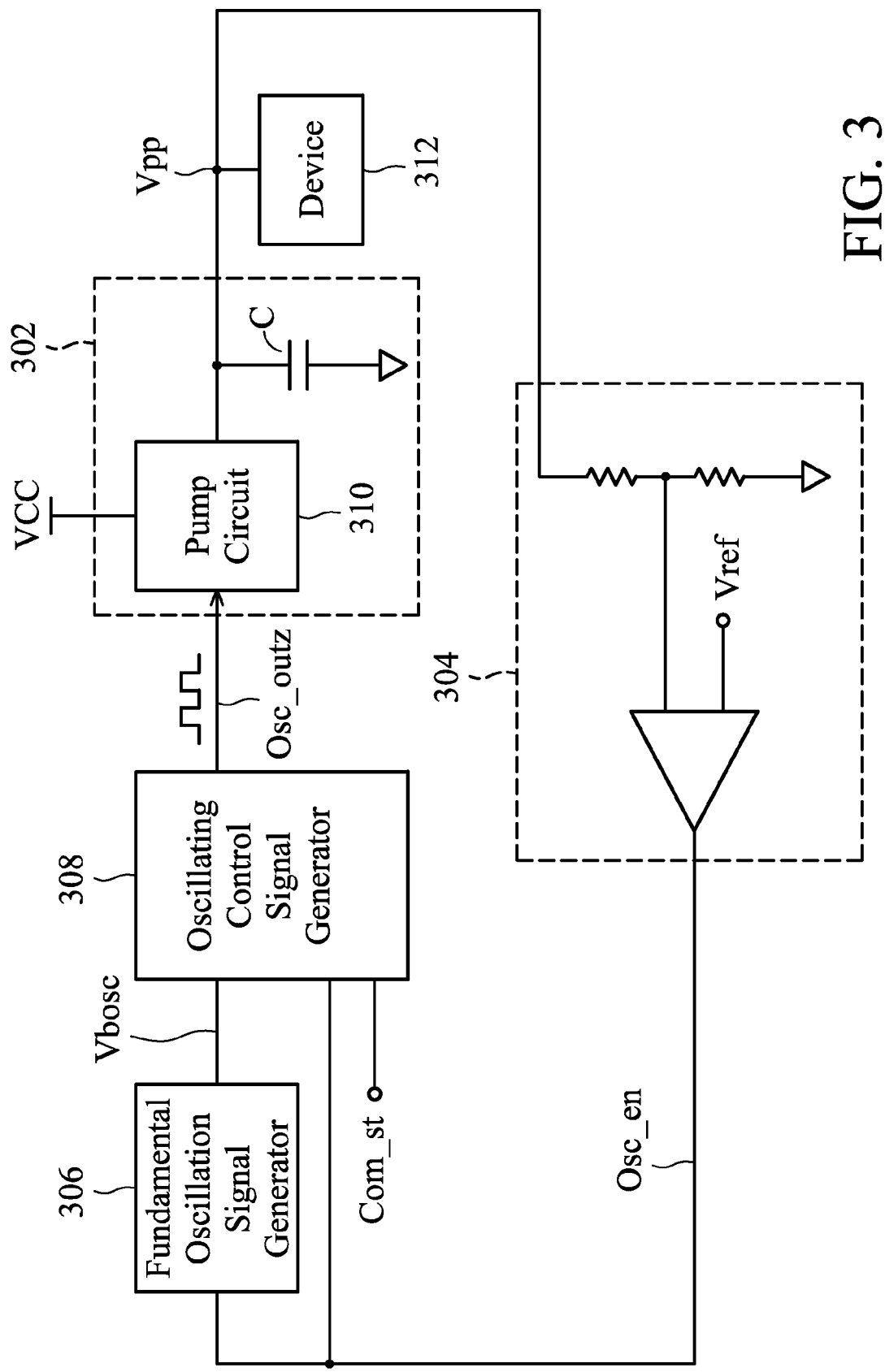
FIG. 3 depicts a voltage doubler in accordance with an exemplary embodiment of the invention.

FIG. 3 depicts a voltage doubler in accordance with an exemplary embodiment of the invention. As shown, a voltage doubler comprises a charge pump 302, a comparator 304, a fundamental oscillation signal generator 306 and an oscillating control signal generator 308.

The charge pump 302 is powered by a first voltage Vcc and has a capacitor C as an energy storage element. The capacitor C is pumped by a pump circuit 310. An oscillating control signal Osc_outz is sent to the pump circuit 310 to pump the capacitor C according to the oscillation of the oscillating control signal Osc_outz and thereby to control a second voltage Vpp provided by the capacitor C. The second voltage Vpp is coupled to the comparator 304 for obtaining a comparison result Osc_en presenting whether the second voltage Vpp is greater than a target value. According to the comparison result Osc_en, the fundamental oscillation signal generator 306 generates a fundamental oscillation signal Vbosc. The fundamental oscillation signal Vbosc is transferred to the oscillating control signal generator 308 as well as the comparison result Osc_en and a signal Com_st. The signal Com_st reflects an electric current consumption status of an output terminal of the charge pump 302. By selectively blocking status changes of the fundamental oscillation signal Vbosc according to the comparison result Osc_en and an electric current consumption status (presented by the signal Com_st), the oscillating control signal generator 308 generates the oscillating control signal Osc_outz which controls the charge pump 302.

In the embodiment shown in FIG. 3, the oscillating control signal generator 308 receives the fundamental oscillation signal Vbosc, the comparison result Osc_en and the signal Com_st by three input terminals, respectively, and outputs the oscillating control signal Osc_outz by an output terminal, and may use a logic circuit to implement the generation of the oscillating control signal Osc_outz. In an exemplary embodiment, the signal Com_st, which reflects the electric current consumption status at the output terminal of the charge pump 302, may be a device enable signal, showing whether the second voltage Vpp powers a device 312 (or, whether the device 312 coupled to the second voltage Vpp is enabled).

Note that in an exemplary embodiment the fundamental oscillation signal generator 306 may stop generating the fundamental oscillation signal Vbosc when the comparison result Osc_en shows that the second voltage Vpp is greater than the target value. In this manner, power consumption is effectively reduced.

Figure 4:
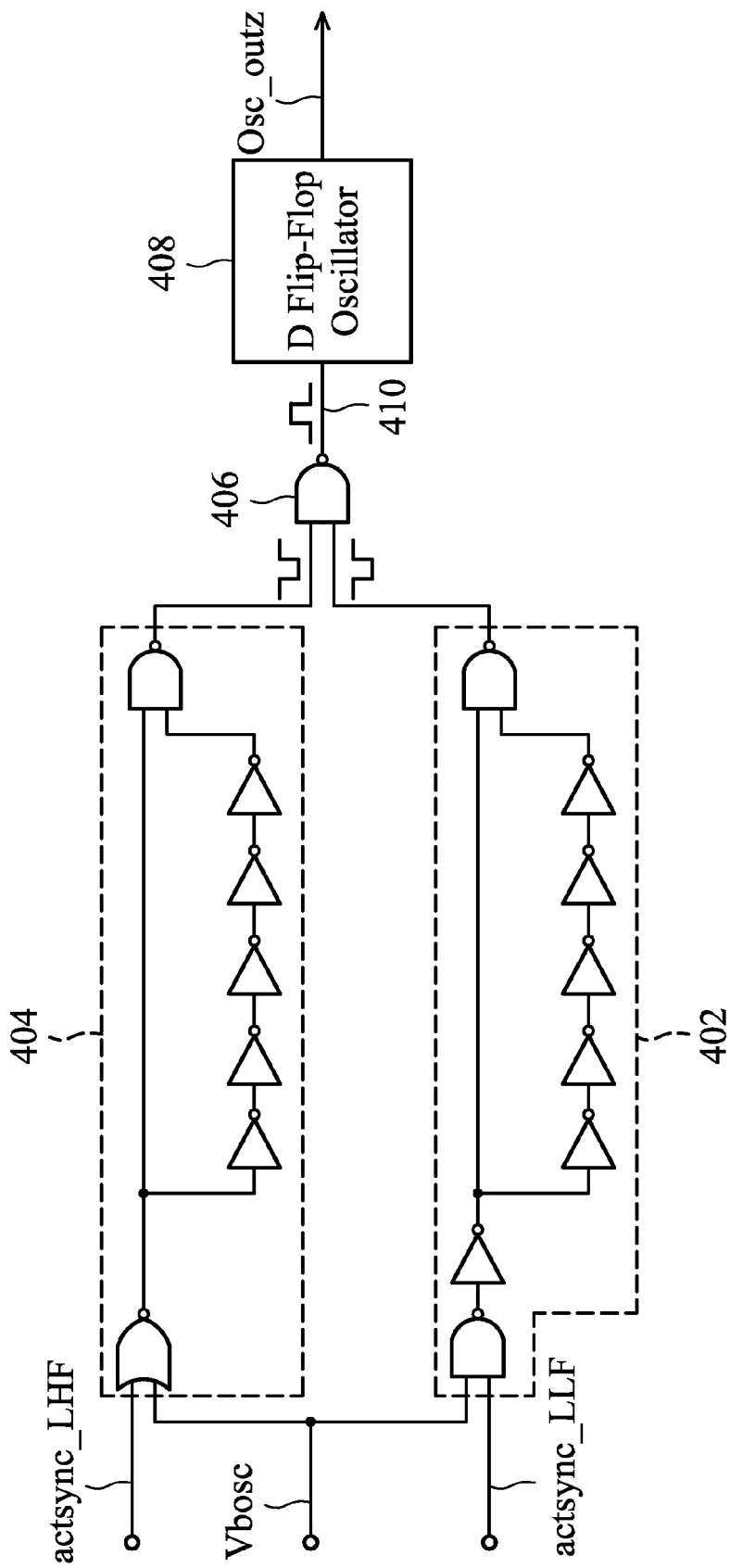
FIG. 4 depicts an exemplary embodiment of the oscillating control signal generator 308, which comprises a rising edge detector 402, a falling edge detector 404, a logic gate 406 and a D flip-flop oscillator 408.

FIG. 4 depicts an exemplary embodiment of the oscillating control signal generator 308, which comprises a rising edge detector 402, a falling edge detector 404, a logic gate 406 and a D flip-flop oscillator 408.

The rising edge detector 402 is enabled by a first enable signal actsync_LLF to detect rising edges of the fundamental oscillation signal Vobsc. In this embodiment, the rising edge detector 402 is enabled by a high status of the first enable signal actsync_LLF and is disabled when the first enable signal actsync_LLF is low. In the enabled case, the rising edge detector 402 outputs a pulse when obtaining a rising edge of the fundamental oscillation signal Vbosc.

The falling edge detector 404 is enabled by a second enable signal actsync_LHF to detect falling edges of the fundamental oscillation signal Vobsc. In this embodiment, the falling edge detector 404 is enabled by a low status of the second enable signal actsync_LHF and is disabled when the second enable signal actsync_LHF is high. In the enabled case, the falling edge detector 404 outputs a pulse when obtaining a falling edge of the fundamental oscillation signal Vbosc.

The logic gate 406 is coupled to receive the pulses output from the rising edge detector 402 and the falling edge detector 404, and, the logic gate 406 has an output terminal 410 outputting a pulse when the rising edge detector 402 detects a rising edge of the fundamental oscillation signal Vbosc or the falling edge detector 404 detects a falling edge of the fundamental oscillation signal Vbosc. In the embodiment shown in FIG. 4, the logic gate 406 is implemented by an NAND gate. Note that the NAND gate does not intend to limit the design of the logic gate 406. The implementation of the logic gate 406 depends on the design of the rising edge and falling edge detectors 402 and 404.

The D flip-flop oscillator 408 is coupled to receive the pulse output from the output terminal 410 of the logic gate 406 and has an output terminal outputting the oscillating control signal Osc_outz. By the D flip-flop oscillator 408, a status change occurs at the oscillating control signal Osc_outz every time the logic gate 406 outputs a pulse.

Note that by a logic circuit comprising the rising edge detector 402, the falling edge detector 404, the logic gate 406 and the D flip-flip oscillator 408, the blockings of the status changes of the fundamental oscillation signal Vbosc are implemented by disabling the rising edge detector 402 or/and the falling edge detector 404.

Figure 5:
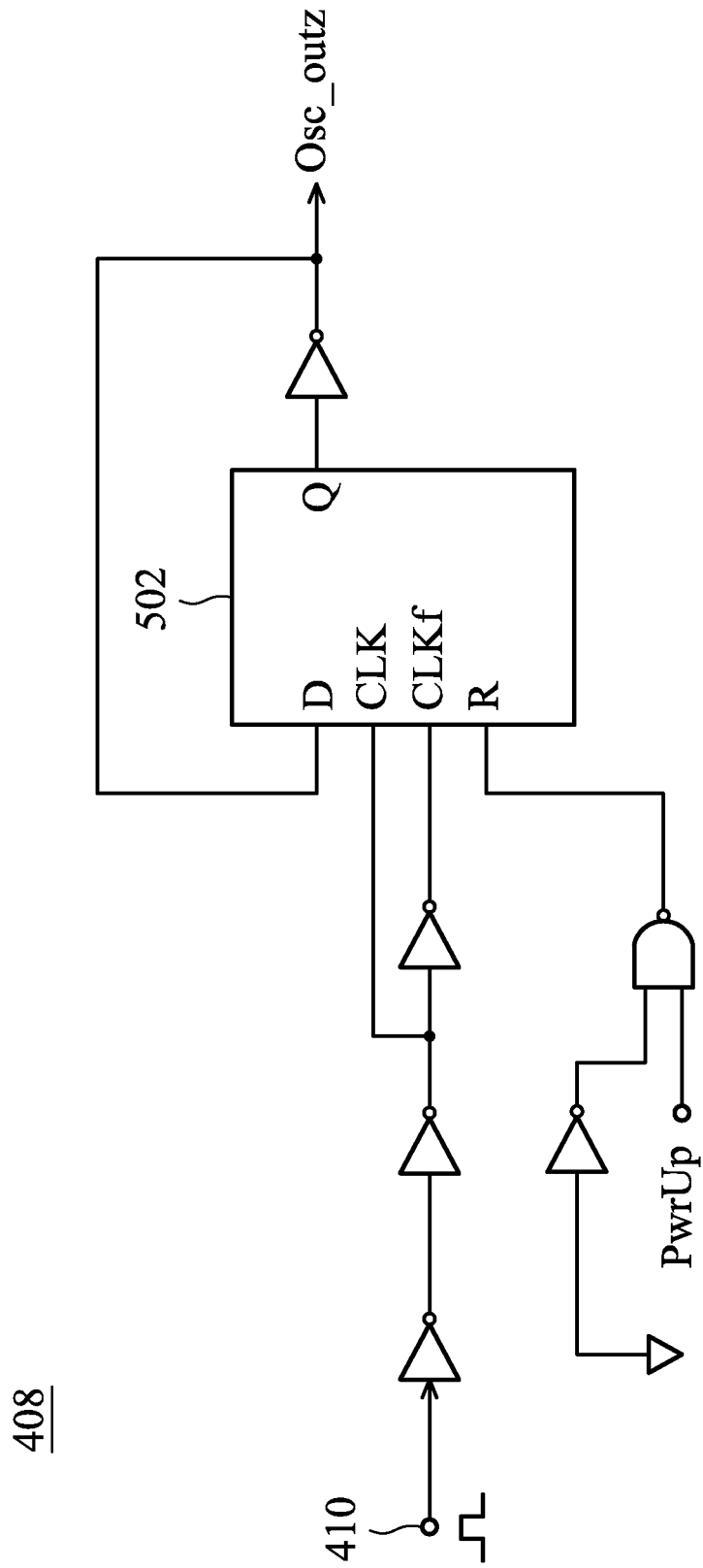
FIG. 5 shows an exemplary embodiment of the D flip-flop oscillator 408, which comprises a D flip-flop 502.

FIG. 5 shows an exemplary embodiment of the D flip-flop oscillator 408, which comprises a D flip-flop 502. The signal provided at the output terminal 410 of the logic gate 406 is conveyed by a series of inverters and is positively input to terminal CLK of the D flip-flops 502 and is further inverted to input the terminal CLKf of the D flip-flops 502. A signal output from terminal Q is inverted and then fed back to the input terminal D. The disabling of the power-up signal PwrUp may reset the D flip-flop 502. As shown, every time a pulse is transferred from the output terminal 410 of the logic gate 406, a status change occurs at the oscillating control signal Osc_outz.

For the generation of the first and second enable signals actsync_LLF and actsync_LHF, the oscillating control signal generator 308 may further comprise a first enable signal generator and a second enable signal generator. The first enable signal generator may generate the first enable signal actsync_LLF based on the comparison result Osc_en and the electric current consumption status Com_st and even the fundamental oscillation signal Vbosc. The second enable signal generator may generate the second enable signal actsync_LHF based on the comparison result Osc_en and the electric current consumption status Com_st and even the fundamental oscillation signal Vbosc. In a case wherein the fundamental oscillation signal Vobsc is taken into consideration in generating the first enable signal actsync_LLF, the first enable signal actsync_LLF may be only triggered when the fundamental oscillation signal Vbosc is low. In a case wherein the fundamental oscillation signal Vobsc is taken into consideration in generating the second enable signal actsync_LHF, the second enable signal actsync_LHF may be only triggered when the fundamental oscillation signal Vbosc is high. In this manner, the duty cycle of the generated oscillating control signal Osc_outz is symmetric.

Referring back to FIG. 4, by controlling the first and second enable signals actsync_LLF and actsync_LHF, the oscillating control signal Osc_outz may be frequency-divided from the fundamental oscillation signal Vbosc. In a first exemplary embodiment, the oscillating control signal Osc_outz oscillates at a half frequency of the fundamental oscillation signal Vbosc when the rising edge detector 402 is enabled and the falling edge detector 404 is disabled. In a second exemplary embodiment, the oscillating control signal Osc_outx oscillates at a half frequency of the fundamental oscillation signal Vbosc when the rising edge detector 402 is disabled and the falling edge detector 404 is enabled. In a third exemplary embodiment, the oscillating control signal Osc_outz oscillates at a quarter of a frequency of the fundamental oscillation signal Vbosc when the rising edge detector 402 is disabled and the falling edge detector 404 is switched on and off at a half frequency of the fundamental oscillation signal Vbosc. In a fourth exemplary embodiment, the oscillating control signal Osc_outz oscillates at a quarter of a frequency of the fundamental oscillation signal Vbosc when the rising edge detector 402 is switched on and off at a half frequency of the fundamental oscillation signal Vbosc and the falling edge detector 404 is disabled.

Figure 6:
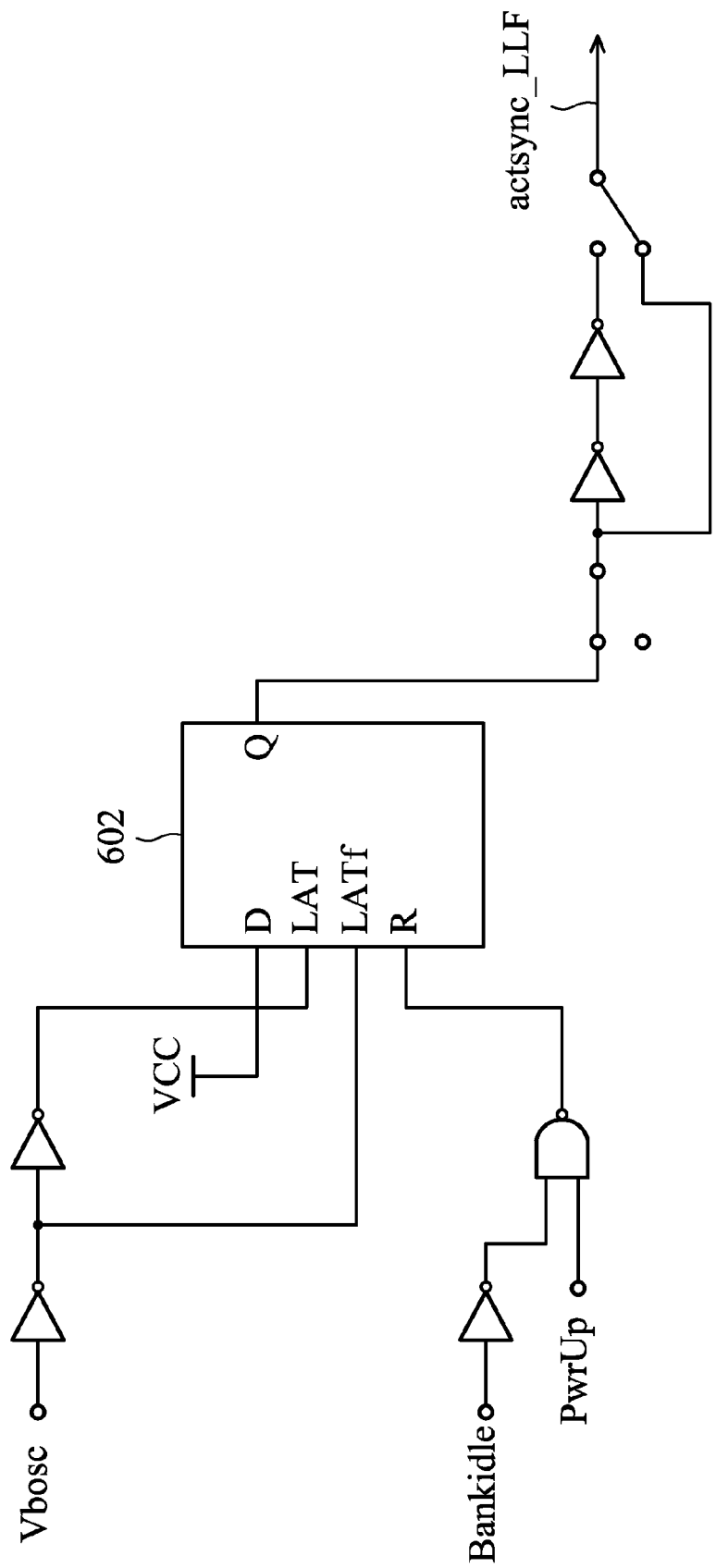
FIG. 6 depicts an exemplary embodiment of the disclosed first enable signal generator.
Figure 7:
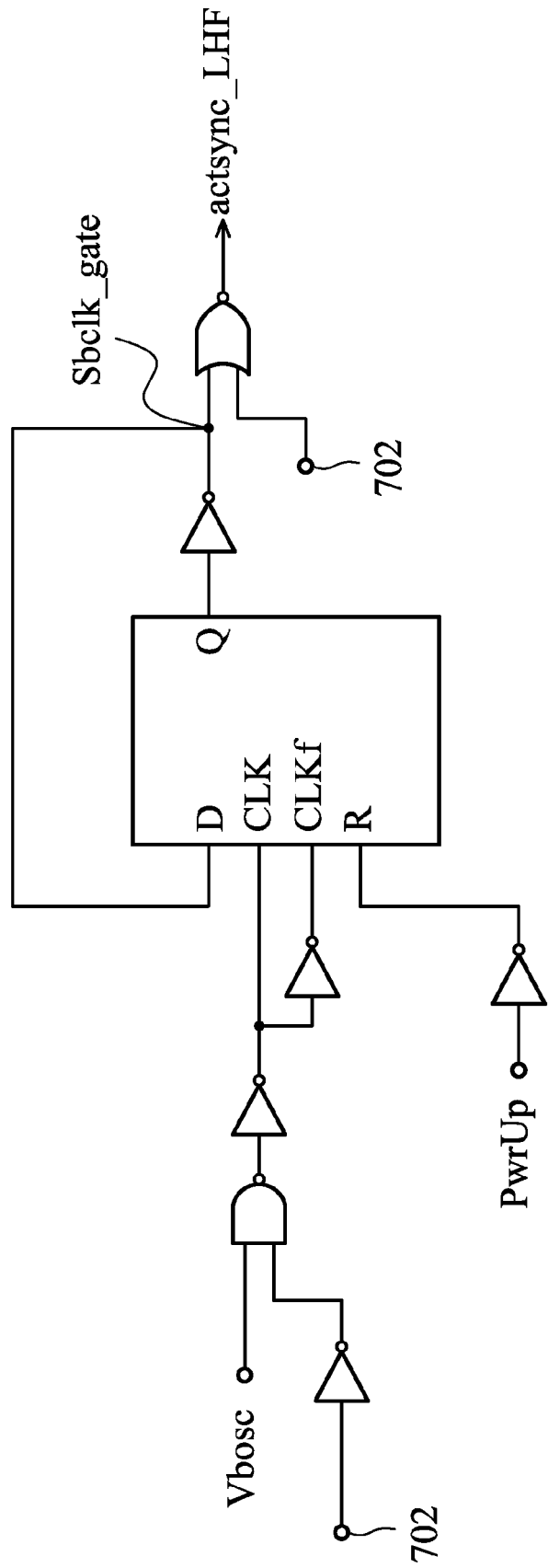
FIG. 7 depicts an exemplary embodiment of the disclosed second enable signal generator.
Figure 8:
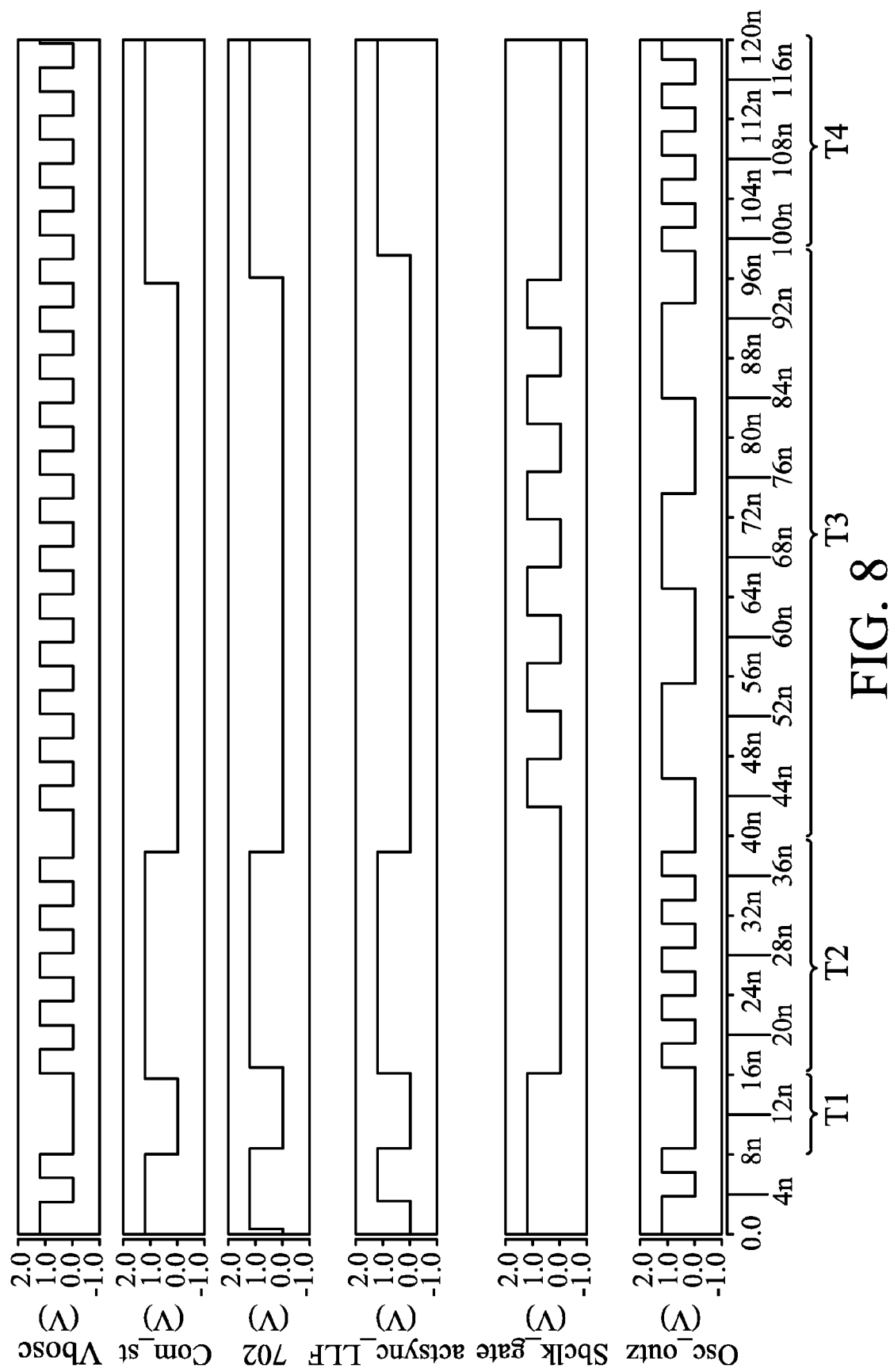
FIG. 8 shows waveforms of signals of the disclosed voltage doubler, wherein the oscillating control signal Osc_outz oscillates at a quarter of the frequency of the fundamental oscillation signal Vbosc when just leakage current exists at the output terminal of the disclosed charge pump.

The following paragraphs show an example which generates an oscillating control signal Osc_outz oscillating at a quarter of a frequency of the fundamental oscillation signal Vbosc when just leakage current exists at the output terminal of the disclosed charge pump. For this example, the first enable signal generator is shown in FIG. 6 and the second enable signal generator is shown in FIG. 7. FIG. 8 shows waveforms of signals of the disclosed voltage doubler.

In the circuit design shown in FIG. 6, the first enable signal generator comprises a latch 602. The signal BankIdle reflects the status of the comparison result Osc_en and the electric current consumption status (presented by signal Com_st). For example, when the comparison result Osc_en shows that the second voltage Vpp is greater than the target value, the signal BankIdle may be high, or, when the electric current consumption is due to just leakage current, the signal BankIdle may be high. By the first enable signal generator shown in FIG. 6, the first enable signal actsync_LLF is only triggered when the fundamental oscillation signal Vbosc is low, for a symmetric duty cycle of the oscillating control signal Osc_outz.

In the circuit design of FIG. 7, a frequency divider is shown. A control signal 702 depends on the comparison result Osc_en, the electric current consumption status (presented by signal Com_st) and even the fundamental oscillation signal Vobsc. When the control signal 702 is low, the frequency divider is activated and a signal Sbclk_gate oscillates at half frequency of the fundamental oscillation signal Vbosc and is inverted to form the second enable signal actsync_LHF.

Referring to FIG. 8, the waveforms of the fundamental oscillation signal Vbosc, the signal Com_st (presenting the electric current consumption status), the signal 702, the first enable signal actsync_LLF, the signal sbclk_gate and the oscillating control signal Osc_outz are shown. The oscillating control signal Osc_outz stops oscillating in a time interval T1 because the fundamental oscillation signal generator (generating Vbosc) is shut off by a comparison result which shows that the voltage Vpp is greater than a target value. In the time interval T2, the fundamental oscillation signal Vbosc is resumed to oscillate because the voltage Vpp drops below the target value, and, due to the high status of the signal Com_st which shows that there is considerable electric current consumption, the oscillating control signal Osc_outz oscillates at the frequency of the fundamental oscillation signal Vbosc to maintain the voltage Vpp. In the time interval T3, the signal Com_st is low to show that just leakage current exists at the output terminal of the charge pump, so that the oscillating control signal Osc_outz oscillates at a quarter of the frequency of the fundamental oscillation signal Vbosc. In the time interval T4, the signal Com_st is switched to high again to show a considerable electric current consumption, so that the oscillating control signal Osc_outz speeds up to oscillate at the frequency of the fundamental oscillation signal Vbosc again to maintain the voltage Vpp. Thus, an oscillating control signal generator generating an oscillating control signal working in a symmetric duty cycle and reacting timely and without glitches is achieved.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A voltage doubler, comprising:
a charge pump powered by a first voltage and having a capacitor as an energy storage element, wherein the charge pump receives an oscillating control signal to charge the capacitor accordingly and thereby to control a second voltage provided by the capacitor;
a comparator, coupled to the charge pump to receive the second voltage provided by the capacitor and output a comparison result presenting whether the second voltage is greater than a target value;
a fundamental oscillation signal generator, generating a fundamental oscillation signal according to the comparison result, wherein the fundamental oscillation signal generator stops generating the fundamental oscillation signal when the comparison result shows that the second voltage is greater than the target value; and
an oscillating control signal generator, generating the oscillating control signal by selectively blocking status changes of the fundamental oscillation signal according to the comparison result and an electric current consumption status at an output terminal of the charge pump,
wherein the oscillating control signal generator comprises:
a rising edge detector, enabled by a first enable signal to detect rising edges of the fundamental oscillation signal;
a falling edge detector, enabled by a second enable signal to detect falling edges of the fundamental oscillation signal;
a logic gate, having an output terminal outputting a pulse when the rising edge detector detects a rising edge of the fundamental oscillation signal or the falling edge detector detects a falling edge of the fundamental oscillation signal; and
a D flip-flop oscillator coupled to the output terminal of the logic gate and having an output terminal outputting the oscillating control signal, wherein by the D flip-flop oscillator a status change occurs at the oscillating control signal in accordance with the pulse generated by the logic gate,
wherein the disabling of the rising edge detector and the falling edge detector implement the blockings of the status changes of the fundamental oscillation signal.

2. The voltage doubler as claimed in claim 1, wherein the oscillating control signal generator further comprises:
a first enable signal generator, generating the first enable signal based on the comparison result and the electric current consumption status; and
a second enable signal generator, generating the second enable signal based on the comparison result and the electric current consumption status.

3. The voltage doubler as claimed in claim 2, wherein:
the first enable signal generator further takes the fundamental oscillation signal into account when generating the first enable signal, to limit the triggering of the first enable signal to a low status of the fundamental oscillation signal; and
the second enable signal generator further takes the fundamental oscillation signal into account when generating the second enable signal, to limit the triggering of the second enable signal to a high status of the fundamental oscillation signal.

4. The voltage doubler as claimed in claim 1, wherein the oscillating control signal generator receives a device enable signal which shows whether the second voltage powers a device and reflects the electric current consumption status at the output terminal of the charge pump.

5. The voltage doubler as claimed in claim 1, wherein the oscillating control signal oscillates at a half frequency of the fundamental oscillation signal when the rising edge detector is enabled and the falling edge detector is disabled.

6. The voltage doubler as claimed in claim 1, wherein the oscillating control signal oscillates at a half frequency of the fundamental oscillation signal when the rising edge detector is disabled and the falling edge detector is enabled.

7. The voltage doubler as claimed in claim 1, wherein the oscillating control signal oscillates at a quarter of a frequency of the fundamental oscillation signal when the rising edge detector is disabled and the falling edge detector is switched on and off at a half frequency of the fundamental oscillation signal.

8. The voltage doubler as claimed in claim 1, wherein the oscillating control signal oscillates at a quarter of a frequency of the fundamental oscillation signal when the rising edge detector is switched on and off at a half frequency of the fundamental oscillation signal and the falling edge detector is disabled.

9. An oscillating control signal generator, for a charge pump powered by a first voltage to provide a second voltage, comprising:
a first input terminal, receiving a fundamental oscillation signal;
a second input terminal, receiving a comparison result showing whether the second voltage is greater than a target value;
a third input terminal, for obtaining an electric current consumption status at an output terminal of the charge pump;
an output terminal, outputting an oscillating control signal for the control of the charge pump; and
a logic circuit, generating the oscillating control signal by selectively blocking status changes of the fundamental oscillation signal according to the comparison result and the electric current consumption status;
wherein the logic circuit comprises:
a rising edge detector, enabled by a first enable signal to detect rising edges of the fundamental oscillation signal;
a falling edge detector, enabled by a second enable signal to detect falling edges of the fundamental oscillation signal;
a logic gate, having an output terminal outputting a pulse when the rising edge detector detects a rising edge of the fundamental oscillation signal or the falling edge detector detects a falling edge of the fundamental oscillation signal; and
a D flip-flop oscillator coupled to the output terminal of the logic gate and having an output terminal outputting the oscillating control signal, wherein by the D flip-flop oscillator a status change occurs at the oscillating control signal in accordance with the pulse generated by the logic gate,
wherein the disabling of the rising edge detector and the falling edge detector implement the blackings of the status changes of the fundamental oscillation signal.

10. The oscillating control signal generator as claimed in claim 9, further comprising:
a first enable signal generator, generating the first enable signal based on the comparison result and the electric current consumption status; and
a second enable signal generator, generating the second enable signal based on the comparison result and the electric current consumption status.

11. The oscillating control signal generator as claimed in claim 10, wherein:
the first enable signal generator further takes the fundamental oscillation signal into account when generating the first enable signal, to limit the triggering of the first enable signal to a low status of the fundamental oscillation signal; and
the second enable signal generator further takes the fundamental oscillation signal into account when generating the second enable signal, to limit the triggering of the second enable signal to a high status of the fundamental oscillation signal.

12. The oscillating control signal generator as claimed in claim 9, wherein the third input terminal thereof receives a device enable signal which shows whether the second voltage powers a device and reflects the electric current consumption status at the output terminal of the charge pump.

13. The oscillating control signal generator as claimed in claim 9, wherein the oscillating control signal oscillates at a half frequency of the fundamental oscillation signal when the rising edge detector is enabled and the falling edge detector is disabled.

14. The oscillating control signal generator as claimed in claim 9, wherein the oscillating control signal oscillates at a half frequency of the fundamental oscillation signal when the rising edge detector is disabled and the falling edge detector is enabled.

15. The oscillating control signal generator as claimed in claim 9, wherein the oscillating control signal oscillates at a quarter of a frequency of the fundamental oscillation signal when the rising edge detector is disabled and the falling edge detector is switched on and off at a half frequency of the fundamental oscillation signal.

16. The oscillating control signal generator as claimed in claim 9, wherein the oscillating control signal oscillates at a quarter of a frequency of the fundamental oscillation signal when the rising edge detector is switched on and off at a half frequency of the fundamental oscillation signal and the falling edge detector is disabled.

* * * * *